United States Patent
Inubushi et al.

(10) Patent No.: US 10,937,954 B2
(45) Date of Patent: *Mar. 2, 2021

(54) MAGNETORESISTIVE EFFECT ELEMENT

(71) Applicant: TDK CORPORATION, Tokyo (JP)

(72) Inventors: Kazuumi Inubushi, Tokyo (JP); Katsuyuki Nakada, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/676,920

(22) Filed: Nov. 7, 2019

(65) Prior Publication Data
US 2020/0075845 A1 Mar. 5, 2020

Related U.S. Application Data

(63) Continuation of application No. 16/081,357, filed as application No. PCT/JP2018/001423 on Jan. 18, 2018, now Pat. No. 10,505,105.

(30) Foreign Application Priority Data

Mar. 3, 2017 (JP) .............................. JP2017-040527

(51) Int. Cl.
*H01L 27/22* (2006.01)
*H01L 43/10* (2006.01)
(Continued)

(52) U.S. Cl.
CPC ........... *H01L 43/10* (2013.01); *H01F 10/325* (2013.01); *H01L 43/02* (2013.01); *H01L 43/08* (2013.01)

(58) Field of Classification Search
CPC .... H01L 27/222; G11C 11/161; H01F 10/325
See application file for complete search history.

(56) References Cited

U.S. PATENT DOCUMENTS 10,020,445 B2  7/2018  Inubushi et al.
10,505,105 B2 * 12/2019  Inubushi ............... H01F 10/325
(Continued)

FOREIGN PATENT DOCUMENTS

JP  2007-273657 A  10/2007
JP  2012-190914 A  10/2012
(Continued)

OTHER PUBLICATIONS

Hari S. Goripati, et al., "Bi-quadratic interlayer exchange coupling in Co2MnSi/Ag/Co2MnSi pseudo spin-valve", Journal of Applied Physics, vol. 110, Issue 12, Dec. 15, 2011, pp. 123914-1-123914-7.
(Continued)

*Primary Examiner* — Mark V Prenty
(74) *Attorney, Agent, or Firm* — Oliff PLC

(57) ABSTRACT

A magnetoresistive effect element includes a first ferromagnetic layer, a second ferromagnetic layer, a nonmagnetic layer, and at least one of a first nonmagnetic insertion layer provided directly on a lower surface of the nonmagnetic layer and a second nonmagnetic insertion layer provided directly on an upper surface of the nonmagnetic layer. The first nonmagnetic insertion layer and the second nonmagnetic insertion layer include an Ag alloy represented by General Formula (1): $Ag_\gamma X_{1-\gamma}$ where X indicates one element selected from the group consisting of Al, Cu, Ga, Ge, As, Y, La, Sm, Yb, and Pt, and $0<\gamma<1$.

20 Claims, 4 Drawing Sheets

(51) Int. Cl.
   *H01F 10/32*   (2006.01)
   *H01L 43/02*   (2006.01)
   *H01L 43/08*   (2006.01)

(56) References Cited

U.S. PATENT DOCUMENTS

| | | |
|---|---|---|
| 2007/0230070 A1 | 10/2007 | Mizuno et al. |
| 2016/0019917 A1 | 1/2016 | Du et al. |
| 2017/0092307 A1 | 3/2017 | Du et al. |
| 2017/0221507 A1 | 8/2017 | Furubayashi et al. |
| 2017/0229643 A1 | 8/2017 | Chen et al. |
| 2018/0226573 A1 | 8/2018 | Chen et al. |

FOREIGN PATENT DOCUMENTS

| | | |
|---|---|---|
| JP | 6137577 B2 | 5/2017 |
| JP | 2017-103419 A | 6/2017 |
| WO | 2016/017612 A1 | 2/2016 |

OTHER PUBLICATIONS

T. Furubayashi, et al., "Structure and transport properties of current-perpendicular-to-plane spin valves using Co2FeAl0.5Si0.5 and Co2MnSi Heusler alloy electrodes", Journal of Applied Physics, vol. 107, Issue 11, Jun. 1, 2010, pp. 113917-1-113917-7.
Sep. 12, 2019 International Preliminary Report on Patentability issued in Application No. PCT/JP2018/001423.

\* cited by examiner (a)

(b)

(a)

(b)

MAGNETORESISTIVE EFFECT ELEMENT

This application is a Continuation of application Ser. No. 16/081,357 filed Aug. 30, 2018, which is a National Stage Entry of PCT/JP2018/001423 filed Jan. 18, 2018, which claims priority to JP 2017-040527 filed Mar. 3, 2017. The disclosure of the prior applications is hereby incorporated by reference herein in its entirety.

TECHNICAL FIELD

The present disclosure relates to a magnetoresistive effect element.

BACKGROUND ART

A magnetoresistive effect element described in Patent Literature 1 has a first half-metal ferromagnetic layer, a second half-metal ferromagnetic layer, and a nonmagnetic metallic substance layer (a nonmagnetic spacer layer) sandwiched between the first half-metal ferromagnetic layer and the second half-metal ferromagnetic layer. These three layers constitute a magnetoresistive layer. At least one of the first half-metal ferromagnetic layer and the second half-metal ferromagnetic layer is formed of a Heusler alloy, and the nonmagnetic metallic substance layer is formed of Ag.

CITATION LIST

Patent Literature

[Patent Literature 1] Japanese Unexamined Patent Application Publication No. 2012-190914

SUMMARY

In the magnetoresistive effect element described in Patent Literature 1, the ferromagnetic layer is formed of a Heusler alloy, and thus lattice mismatch between the ferromagnetic layer and the nonmagnetic metallic substance layer formed of Ag is large. In the magnetoresistive effect element in which lattice mismatch between the ferromagnetic layer and the nonmagnetic metallic substance layer in the magnetoresistive layer is large like this, it is difficult to improve crystallinities of these layers, and thus it is difficult to sufficiently improve a magnetoresistive effect.

The present disclosure was made in view of the aforementioned problems, and an object thereof is to provide a magnetoresistive effect element having a large magnetoresistive effect.

A magnetoresistive effect element according to the present disclosure includes: a first ferromagnetic layer as a magnetization fixed layer; a second ferromagnetic layer as a magnetization free layer; and a nonmagnetic spacer layer provided between the first ferromagnetic layer and the second ferromagnetic layer. The nonmagnetic spacer layer comprises a nonmagnetic metal layer formed of Ag, and at least one of a first nonmagnetic insertion layer provided on a lower surface of the nonmagnetic metal layer and a second nonmagnetic insertion layer provided on an upper surface of the nonmagnetic metal layer, the first nonmagnetic insertion layer and the second nonmagnetic insertion layer comprising an Ag alloy represented by General Formula (1), and thereby lattice mismatch between the nonmagnetic spacer layer, and the first ferromagnetic layer and/or the second ferromagnetic layer being reduced, compared to lattice mismatch when the entire nonmagnetic spacer layer is formed of Ag.

$$Ag_\gamma X_{1-\gamma} \tag{1}$$

where X indicates one element selected from the group consisting of Al, Cu, Ga, Ge, As, Y, La, Sm, Yb, and Pt, and $0<\gamma<1$ According to this magnetoresistive effect element, the nonmagnetic spacer layer comprises at least one of the first nonmagnetic insertion layer and the second nonmagnetic insertion layer that comprises the Ag alloy represented by General Formula (1) such that the lattice mismatch between the nonmagnetic spacer layer, and the first ferromagnetic layer and/or the second ferromagnetic layer is reduced, compared to when the entire nonmagnetic spacer layer is formed of Ag. For this reason, according to this magnetoresistive effect element, crystallinities of the first ferromagnetic layer and/or the second ferromagnetic layer, and a crystallinity of the nonmagnetic spacer layer are improved, so that a large magnetoresistive effect can be exhibited.

In the magnetoresistive effect element according to the present disclosure, a crystalline structure of the Ag alloy represented by General Formula (1) may have a face-centered cubic lattice structure.

According to this magnetoresistive effect element, since the crystalline structure of the Ag alloy has a face-centered cubic lattice structure, the nonmagnetic spacer layer, the first ferromagnetic layer, and the second ferromagnetic layer are stacked with high crystalline properties. Due to the high crystalline properties, the magnetoresistive effect element according to the present disclosure can exhibit a large magnetoresistive effect.

In the magnetoresistive effect element according to the present disclosure, γ of General Formula (1) may satisfy $0.75<\gamma<1$.

According to this magnetoresistive effect element, the crystalline structures of the first nonmagnetic insertion layer and the second nonmagnetic insertion layer can stably have a face-centered cubic lattice structure. As a result, since the nonmagnetic spacer layer, the first ferromagnetic layer, and the second ferromagnetic layer are stacked with higher crystalline properties, a larger magnetoresistive effect is exhibited.

In the magnetoresistive effect element according to the present disclosure, at least one of the first ferromagnetic layer and the second ferromagnetic layer may comprise a Heusler alloy represented by General Formula (2).

$$Co_2L_\alpha M_\beta \tag{2}$$

where L is at least one or more elements of Mn and Fe, M indicates one or more elements selected from the group consisting of Si, Al, Ga, and Ge, $0.7<\alpha<1.6$, and $0.65<\beta<1.35$ According to this magnetoresistive effect element, since $0.7<\alpha<1.6$ and $0.65<\beta<1.35$, the Heusler alloys for the first ferromagnetic layer and the second ferromagnetic layer have lattice constants close to a case in which it has a stoichiometric composition. As a result, lattice mismatch between the first ferromagnetic layer and/or the second ferromagnetic layer and the nonmagnetic spacer layer can be reduced.

In the magnetoresistive effect element according to the present disclosure, in General Formula (1), X may be one element selected from the group consisting of Y, La, Sm, Yb, and Pt.

According to this magnetoresistive effect element, the elements comprised by the first ferromagnetic layer and the second ferromagnetic layer and the elements comprised by the first nonmagnetic insertion layer and the second nonmagnetic insertion layer belong to neither the same group nor the same period in the periodic table of the elements. Therefore, diffusion of the elements comprised thereby between the first ferromagnetic layer or the second ferromagnetic layer and the nonmagnetic spacer layer is suppressed.

In the magnetoresistive effect element according to the present disclosure, α+β of General Formula (2) may satisfy 2<α+β<2.6.

According to this magnetoresistive effect element, half-metal characteristics are easily maintained in the Heusler alloy comprised by the first ferromagnetic layer and the second ferromagnetic layer.

In the magnetoresistive effect element according to the present disclosure, when a thickness of the first nonmagnetic insertion layer is defined as t1, t1 may satisfy 0.2 nm<t1<10 nm, and when a thickness of the second nonmagnetic insertion layer is defined as t2, t2 may satisfy 0.2 nm<t2<10 nm.

According to this magnetoresistive effect element, when t1<10 nm and/or t2<10 nm, spin scattering in electrons that move from the first ferromagnetic layer to the second ferromagnetic layer is further reduced. When 0.2 nm<t1 and/or 0.2 nm<t2, lattice mismatch between the nonmagnetic spacer layer and the first ferromagnetic layer and/or the second ferromagnetic layer is further reduced. As a result, a magnetoresistive effect is particularly increased.

According to the present disclosure, a magnetoresistive effect element having a large magnetoresistive effect can be provided.

Figure 3:
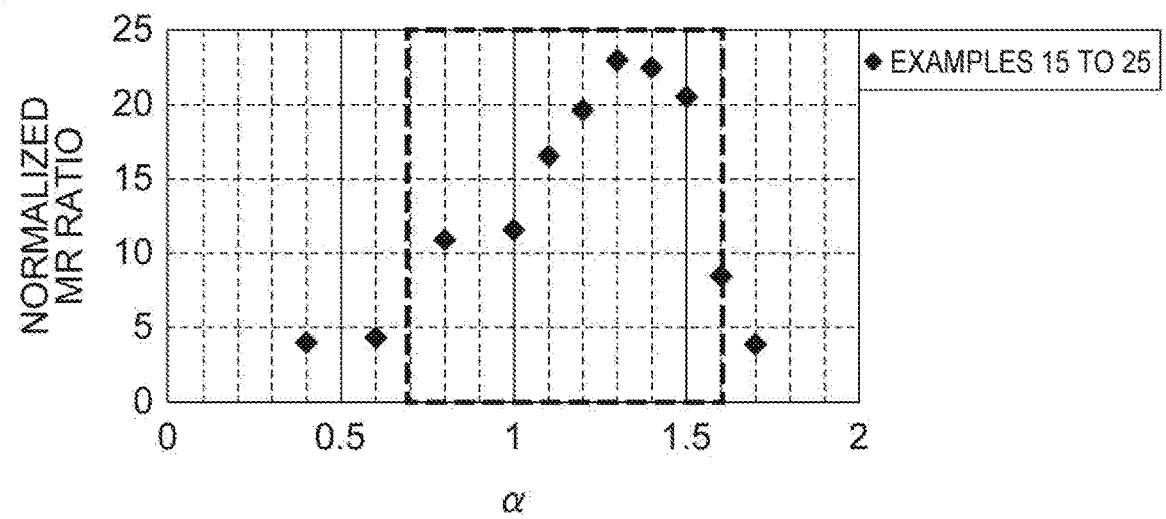
Figure 3:
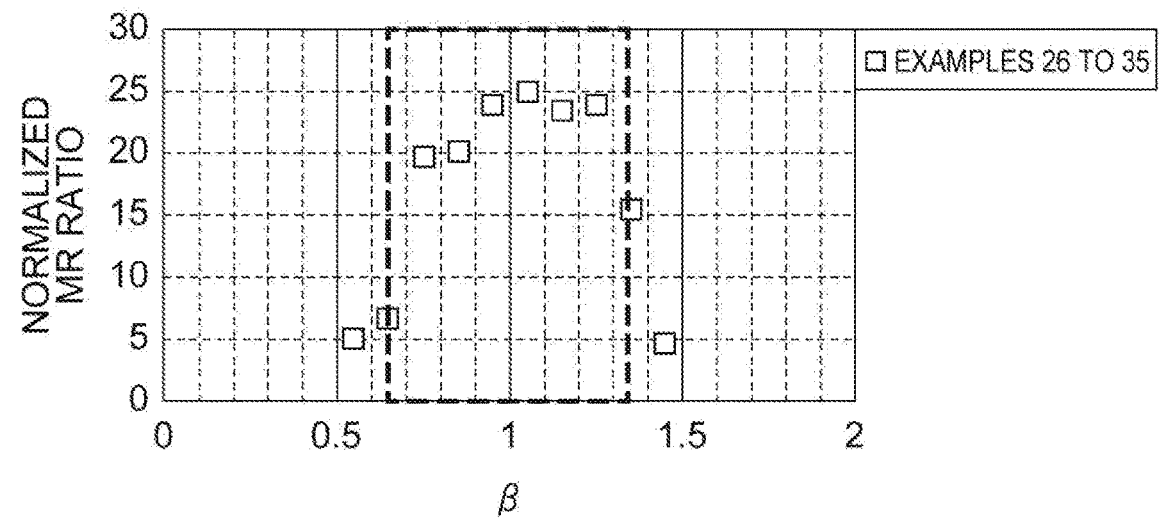

Part (a) of FIG. 3 is a diagram illustrating a relationship between α and a normalized MR ratio, and part (b) of FIG. 3 is a diagram illustrating a relation between β and the normalized MR ratio.

Figure 4:
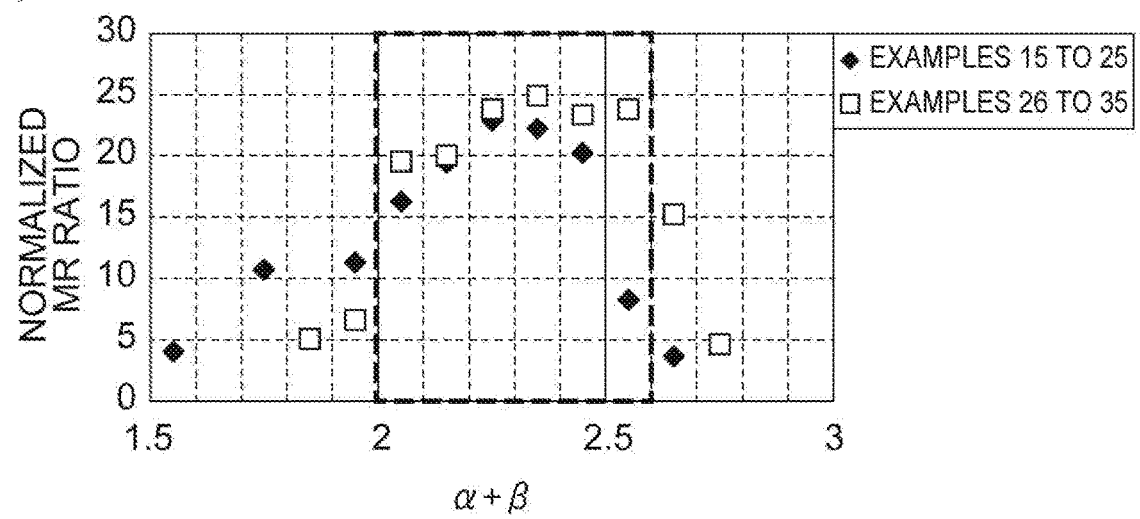
Figure 4:
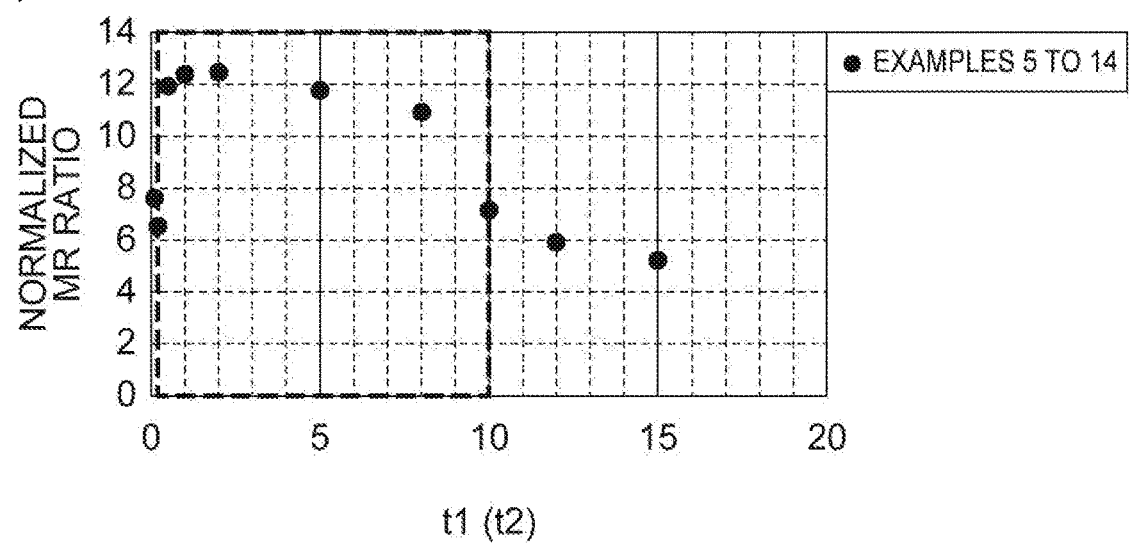

Part (a) of FIG. 4 is a diagram illustrating a relationship between α+β and the normalized MR ratio, and part (b) of FIG. 4 is a diagram illustrating a relationship between a thickness t1 of a first nonmagnetic insertion layer or a thickness t2 of a second nonmagnetic insertion layer and the normalized MR ratio.

DESCRIPTION OF EMBODIMENTS

Hereinafter, an embodiment of the present disclosure will be described in detail with reference to the attached drawings. In each of the drawings, where possible, the same reference signs are used for the same elements. Further, dimensional ratios in constituent elements and between constituent elements in the drawings are arbitrary to facilitate understanding of the drawings.

Figure 1:
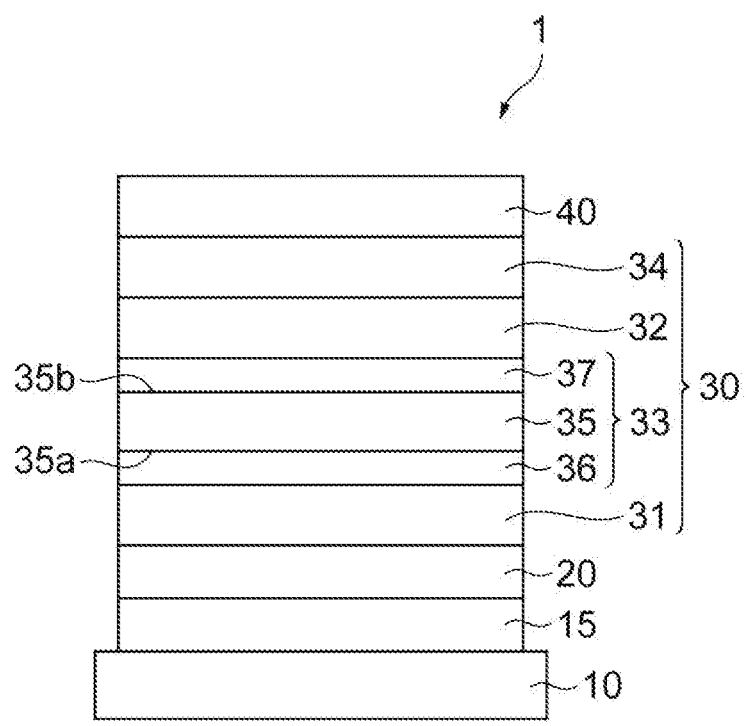
FIG. 1 is a diagram illustrating a cross section of a magnetoresistive effect element according to an embodiment.

FIG. 1 is a view illustrating a cross section of a magnetoresistive effect element according to an embodiment. A magnetoresistive effect element 1 includes a substrate 10, a crystal orientation layer 15, an underlayer 20, a magnetoresistive layer 30, and a cap layer 40 in this order. The magnetoresistive layer 30 has a first ferromagnetic layer 31 as a magnetization free layer, a second ferromagnetic layer 32 as a magnetization fixed layer, a nonmagnetic spacer layer 33 provided between the first ferromagnetic layer 31 and the second ferromagnetic layer 32, and an antiferromagnetic layer 34. The second ferromagnetic layer 32 is provided on the nonmagnetic spacer layer 33, and the antiferromagnetic layer 34 is provided on the second ferromagnetic layer 32. The nonmagnetic spacer layer 33 has a nonmagnetic metal layer 35, a first nonmagnetic insertion layer 36 that is provided on a lower surface 35a of the nonmagnetic metal layer 35, and a second nonmagnetic insertion layer 37 that is provided on an upper surface 35b of the nonmagnetic metal layer 35.

The magnetoresistive effect element 1 is fabricated by stacking each of the layers from the crystal orientation layer 15 to the cap layer 40 on the substrate 10 by manufacturing method such as sputtering method or vapor deposition method. The magnetoresistive effect element 1 is a magnetoresistive effect element having a current perpendicular to plane (CPP) structure in which a detecting current flows along a stacking direction (a direction perpendicular to a film surface of each layer).

The substrate 10 comprises, for instance, a metal oxide single crystal, a silicon single crystal, a silicon single crystal with a thermally oxidized film, a sapphire single crystal, a ceramic, quartz, or glass. The material comprised by the substrate 10 is not particularly limited as long as it has a suitable mechanical strength and is suitable for an annealing process or microfabrication process. As the metal oxide single crystal, for instance, an MgO single crystal can be exemplified. According to the substrate comprising MgO single crystal, an epitaxial growth film is easily formed. The epitaxial growth film can exhibit large magnetoresistive characteristics.

The underlayer 20 can be an electrode for applying a detecting current, and comprises at least one metal element from, for instance, Ag, Au, Cu, Cr, V, Al, W, and Pt. The underlayer 20 may comprise an alloy of these metal elements or a stacked structure formed of materials composed of two or more of these metal elements. Alloys of these metal elements include, for instance, an AgZn alloy, an AgMg alloy, and a NiAl alloy which are of cubic crystal types. If needed, the crystal orientation layer 15 for controlling the crystal orientation of the upper layers may be provided between the underlayer 20 and the substrate 10. The crystal orientation layer 15 comprises at least one of, for instance, MgO, TiN, and NiTa alloys.

The nonmagnetic metal layer 35 included in the nonmagnetic spacer layer 33 is formed of Ag. The first nonmagnetic insertion layer 36 and the second nonmagnetic insertion layer 37 comprise an Ag alloy expressed by General Formula (1).

$$Ag_\gamma X_{1-\gamma} \quad (1)$$

In General Formula (1), X is one element selected from the group consisting of Al, Cu, Ga, Ge, As, Y, La, Sm, Yb, and Pt, and γ is 0<γ<1. A thickness of the nonmagnetic metal layer 35 is, for instance, no less than 1 nm and no more than 10 nm. The nonmagnetic spacer layer 33 may have only one of the first nonmagnetic insertion layer 36 and the second nonmagnetic insertion layer 37.

The first ferromagnetic layer 31 functioning as the magnetization free layer is formed of a soft magnetic material, and a magnetization direction thereof is not substantially fixed. For this reason, when an external magnetic field of a measurement target is applied, the magnetization direction is easily changed to a direction of the application. A magnetization direction of the second ferromagnetic layer 32 functioning as the magnetization fixed layer changes with respect to the external magnetic field with more difficulty than the magnetization direction of the first ferromagnetic layer 31. Preferably, the magnetization direction of the second ferromagnetic layer 32 is substantially fixed with respect to the external magnetic field of the measurement target, and does not substantially change with respect to the external magnetic field of the measurement target. The external magnetic field is applied to the magnetoresistive layer 30, and a relative magnetization direction between the first ferromagnetic layer 31 and the second ferromagnetic layer 32 is changed. Thereby, a resistance value of the magnetoresistive layer 30 changes and thus a magnetoresistive effect is exhibited.

The antiferromagnetic layer 34 is provided on a surface of the second ferromagnetic layer 32 which is on the side opposite to the side of the nonmagnetic spacer layer 33. The antiferromagnetic layer 34 is used to substantially fix the magnetization direction of the second ferromagnetic layer 32 by exchange-coupling with the second ferromagnetic layer 32 and imparting unidirectional anisotropy to the second ferromagnetic layer 32. As materials of the antiferromagnetic layer 34, for instance, an FeMn alloy, a PtMn alloy, a PtCrMn alloy, an NiMn alloy, an IrMn alloy, NiO, and $Fe_2O_3$ can be exemplified. A thickness of the first ferromagnetic layer 31 ranges, for instance, from 1 nm to 20 nm, and a thickness of the second ferromagnetic layer 32 ranges, for instance, from 1 nm to 20 nm. A thickness of the antiferromagnetic layer 34 ranges, for instance, from 5 nm to 15 nm. In the case where a coercivity of the second ferromagnetic layer 32 is made greater than that of the first ferromagnetic layer 31 and has a magnitude such that the magnetization direction of the second ferromagnetic layer 32 is substantially fixed with respect to the external magnetic field of the measurement target, for example, by a method of changing the thicknesses of the first and second ferromagnetic layers 31 and 32, the antiferromagnetic layer 34 need not necessarily be provided.

In the magnetoresistive layer 30, one of the first and second ferromagnetic layers 31 and 32 may be a magnetization free layer, and the other may be a magnetization fixed layer. Thus, the first ferromagnetic layer 31 may be the magnetization fixed layer, and the second ferromagnetic layer 32 may be the magnetization free layer. In this case, the antiferromagnetic layer 34 is provided on the surface of the first ferromagnetic layer 31 which is on the side opposite to the side of the nonmagnetic spacer layer 33.

At least one of the first and second ferromagnetic layers 31 and 32 can comprise a Heusler alloy expressed by General Formula (2), and is preferably substantially formed of the Heusler alloy.

$$Co_2L_\alpha M_\beta \quad (2)$$

In General Formula (2), L is at least one or more elements of Mn and Fe, and M is one or more elements selected from the group consisting of Si, Al, Ga, and Ge. Further, $0.7<\alpha<1.6$, and $0.65<\beta<1.35$.

The Heusler alloy expressed by General Formula (2) has a high spin polarizability, and is thus preferred because the magnetoresistive effect element 1 can then exhibit a large magnetoresistive effect. Since the conditions of $0.7<\alpha<1.6$ and $0.65<\beta<1.35$ are satisfied, the Heusler alloys for the first and second ferromagnetic layers 31 and 32 have lattice constants close to cases in which they have stoichiometric compositions. For this reason, the following effect that lattice mismatch between the first ferromagnetic layer 31 and/or the second ferromagnetic layer 32 and the nonmagnetic spacer layer 33 is reduced is especially significant. However, the conditions of $0.7<\alpha<1.6$ and $0.65<\beta<1.35$ in the Heusler alloy may not be satisfied.

A crystalline structure of the Heusler alloy can be an A2 structure, a B2 structure, or an $L2_1$ structure. A Heusler alloy of the B2 structure is preferable because it has a higher spin polarizability than the Heusler alloy of the A2 structure, and the Heusler alloy of the $L2_1$ structure is more preferable because it has a higher spin polarizability than the Heusler alloy of the B2 structure.

Table 1 is a table that gives literature values for spin polarizabilities P of some Heusler alloys in which General Formula (2) is satisfied, Fe and Co. The spin polarizabilities P of the Heusler alloys satisfying General Formula (2) are shown to be greater than 46% for the spin polarizability of Fe and 45% for the spin polarizability of Co.

TABLE 1

| Heusler alloy | P (%) |
|---|---|
| $Co_2Mn(Ge_{0.75}Ga_{0.25})$ | 74 |
| $Co_2Mn(Ga_{0.5}Sn_{0.5})$ | 72 |
| $Co_2Fe(Si_{0.75}Ge_{0.25})$ | 70 |
| $Co_2Fe(Ga_{0.5}Ge_{0.5})$ | 68 |
| $Co_2(Cr_{0.02}Fe_{0.98})Ga$ | 67 |
| $Co_2Mn(GeSn)$ | 67 |
| $Co_2(Mn_{0.95}Fe_{0.05})Sn$ | 65 |
| $(Co, Fe)_2MnGe$ | 65 |
| $Co_2(Mn_{0.5}Fe_{0.5})Ga$ | 65 |
| $Co_2(Cr_{0.02}Fe_{0.98})Si$ | 65 |
| $Co_2Mn(Ti, Sn)$ | 64 |
| $Co_2Mn(Al_{0.5}Sn_{0.5})$ | 63 |
| $Co_2Mn(Ga_xSi_{1-x})$ | 63 |
| $Co_2Fe(Al, Ga)$ | 63 |
| $Co_2Mn(SiGe)$ | 63 |
| $Co_2(Mn_{0.5}Fe_{0.5})Si$ | 61 |
| $Co_2(Cr, Fe)Al$ | 60 |
| $Co_2Mn(Al_{0.5}Si_{0.5})$ | 60 |
| $Co_2Fe(Ga_{0.5}Si_{0.5})$ | 60 |
| $Co_2Fe(Al_{0.5}Si_{0.5})$ | 60 |
| $Co_2MnSi$ | 56 |
| $Co_2MnGe$ | 58 |
| $Co_2MnSn$ | 60 |
| $Co_2MnAl$ | 60 |
| $Co_2MnGa$ | 60 |
| $Co_2CrAl$ | 62 |
| $Co_2FeAl$ | 59 |
| $Co_2FeSi$ | 60 |
| $Co_2FeGa$ | 58 |
| $Co_2CrGa$ | 61 |
| $Co_2TiSn$ | 57 |
| $Co_2VAl$ | 48 |
| Fe | 46 |
| Co | 45 |

The first ferromagnetic layer 31 and the second ferromagnetic layer 32 can comprise a Heusler alloy other than General Formula (2) such as $Co_2CrIn$, $Co_2CrSn$, or the like, or a ferromagnetic material such as $Fe_3O_4$, $CrO_2$, CoFeB, or the like, or be substantially formed of the ferromagnetic material.

The cap layer 40 is provided to protect the magnetoresistive layer 30. The cap layer 40 may comprise, for instance, one or more elements of Ru, Ag, Al, Cu, Au, Cr, Mo, Pt, W, Ta, Pd, and Ir, an alloy of these metal elements, or a stacked structure of materials composed of two or more of these metal elements.

In a process of manufacturing the magnetoresistive effect element 1, an annealing process is performed as needed. If needed, a magnetic field applying treatment is performed, and magnetic anisotropy such as uniaxial magnetic anisotropy is imparted to the first ferromagnetic layer 31 and/or the second ferromagnetic layer 32. The magnetic field applying treatment may be performed along with the annealing process.

In the magnetoresistive effect element 1 of the present embodiment as described above, the nonmagnetic spacer layer 33 comprises at least one of the nonmagnetic metal layer 35 formed of Ag, the first nonmagnetic insertion layer 36 provided on the lower surface 35a of the nonmagnetic metal layer 35, and the second nonmagnetic insertion layer 37 provided on the upper surface 35b of the nonmagnetic metal layer 35, and the first nonmagnetic insertion layer 36 and the second nonmagnetic insertion layer 37 comprises the Ag alloy represented by General Formula (1), and thereby the lattice mismatch between the nonmagnetic spacer layer 33 and the first ferromagnetic layer 31 and/or the second ferromagnetic layer 32 is smaller than lattice mismatch when it is assumed that the nonmagnetic spacer layer 33 is formed of Ag. For example, the lattice mismatch between the nonmagnetic spacer layer 33 that includes the first nonmagnetic insertion layer 36 and/or the second nonmagnetic insertion layer 37 formed of $Ag_\gamma Ga_{1-\gamma}$ that satisfies General Formula (1) and the first ferromagnetic layer 31 and/or the second ferromagnetic layer 32 is smaller than an assumed lattice mismatch between the nonmagnetic spacer layer 33, the entirety of which is assumed to be formed of Ag and the first ferromagnetic layer 31 and/or the second ferromagnetic layer 32. For this reason, according to the magnetoresistive effect element 1 of the present embodiment, since crystallinities of the first ferromagnetic layer 31 and/or the second ferromagnetic layer 32 and a crystallinity of the nonmagnetic spacer layer 33 are improved, a large magnetoresistive effect can be exhibited.

In the aforementioned magnetoresistive effect element 1 of the present embodiment, a crystalline structure of the Ag alloy for the first nonmagnetic insertion layer 36 and the second nonmagnetic insertion layer 37 may have a face-centered cubic lattice structure (an fcc structure). Because the crystalline structure of the Ag alloy can have an fcc structure, the nonmagnetic spacer layer 33 is stacked between the first ferromagnetic layer 31 and the second ferromagnetic layer 32 with a high crystalline properties. Due to these high crystalline properties, the magnetoresistive effect element according to the present embodiment can exhibit a large magnetoresistive effect. This effect is especially remarkable when crystalline structures of the first and second ferromagnetic layers 31 and 32 also have an fcc structure.

In the aforementioned magnetoresistive effect element 1 of the present embodiment, γ in the Ag alloy comprised by the first nonmagnetic insertion layer 36 and the second nonmagnetic insertion layer 37 may satisfy 0.75<γ<1. Thereby, the crystalline structures of the first nonmagnetic insertion layer 36 and the second nonmagnetic insertion layer 37 can more stably have an fcc structure, and thus the nonmagnetic spacer layer 33, the first ferromagnetic layer 31 and the second ferromagnetic layer 32 can be stacked with higher crystalline properties. This effect is especially remarkable when the first and second ferromagnetic layers 31 and 32 also have an fcc structure. However, the condition of 0.75<γ<1 may not be satisfied in the Ag alloy for the first nonmagnetic insertion layer 36 and the second nonmagnetic insertion layer 37.

Further, in the aforementioned magnetoresistive effect element 1 of the present embodiment, γ in the Ag alloy comprised in the first nonmagnetic insertion layer 36 and the second nonmagnetic insertion layer 37 preferably satisfies γ<0.98, and more preferably satisfies γ<0.96. Further, γ preferably satisfies γ<0.90, and more preferably satisfies γ<0.85. When γ in the Ag alloy has these values, a proportion of Ag comprised by the first nonmagnetic insertion layer 36 and the second nonmagnetic insertion layer 37 is reduced. The nonmagnetic spacer layer 33 in which the proportion of Ag is reduced and which comprises the first nonmagnetic insertion layer 36 and the second nonmagnetic insertion layer 37 can especially reduce the lattice mismatch between the nonmagnetic spacer layer 33 and the first ferromagnetic layer 31 and/or the second ferromagnetic layer 32, compared to the nonmagnetic spacer layer 33, the entirety of which is formed of Ag.

In the aforementioned magnetoresistive effect element 1 of the present embodiment, X in General Formula (1) may be one element selected from the group consisting of Y, La, Sm, Yb, and Pt. In this case, the elements comprised by the first and second ferromagnetic layers 31 and 32 and the elements comprised by the first nonmagnetic insertion layer 36 and the second nonmagnetic insertion layer 37 belong to neither the same group nor the same period in the periodic table of elements. For this reason, diffusion of the elements comprised by these layers is suppressed between the first ferromagnetic layer 31 and the nonmagnetic spacer layer 33 and between the second ferromagnetic layer 32 and the nonmagnetic spacer layer 33. The suppression of the diffusion increases the magnetoresistive effect.

In the aforementioned magnetoresistive effect element 1 of the present embodiment, X in General Formula (1) may be one selected from the group consisting of La, Sm, Yb, and Pt. In this case, in the periodic table of elements, a period to which the elements comprised in the first and second ferromagnetic layers 31 and 32 belongs and a period to which the elements comprised in the first nonmagnetic insertion layer 36 and the second nonmagnetic insertion layer 37 belong are two or more periods removed from each other. For this reason, diffusion of the elements comprised in these layers is further suppressed between the first ferromagnetic layer 31 and the nonmagnetic spacer layer 33 and between the second ferromagnetic layer 32 and the nonmagnetic spacer layer 33. The suppression of the diffusion further increases the magnetoresistive effect.

In General Formula (2), the sum of α and β may satisfy 2<α+β<2.6. In the Heusler alloy represented by General Formula (2), it has been theoretically shown that the spin polarizability is reduced when Co is substituted with an L or M site, and that an influence on the spin polarizability is small when the element of the L or M site is substituted with a Co site. For this reason, when 2<α+β, Co is suppressed from being substituted with the L or M site, and thus a reduction in spin polarizability caused by element substitution is suppressed. On the other hand, when 2.6≤α+β, an amount of magnetization of the Heusler alloy is reduced. For this reason, when the condition of 2<α+β<2.6 is satisfied in the Heusler alloy, half-metal characteristics are easily maintained, so that a larger magnetoresistive effect can be obtained. However, the condition of 2<α+β<2.26 may not be satisfied in the Heusler alloy.

In the aforementioned magnetoresistive effect element 1 of the present embodiment, when a thickness t1 of the first nonmagnetic insertion layer 36 is defined as t1, 0.2 nm<t1<10 nm, and when a thickness of the second nonmagnetic insertion layer 37 is defined as t2, 0.2 nm<t2<10 nm, for the following reasons. That is, the Ag alloy comprised in the first nonmagnetic insertion layer 36 and the second nonmagnetic insertion layer 37 has a shorter spin diffusion length than Ag that is a pure metal. For this reason, when t1<10 nm and/or t2<10 nm, electrons moving between the first ferromagnetic layer 31 and the second ferromagnetic layer 32 can be sufficiently suppressed from undergoing spin scattering at the first nonmagnetic insertion layer 36 and/or the second nonmagnetic insertion layer 37 during the movement, and thus a magnetoresistive effect is particularly increased. Further, when 0.2 nm<t1 and/or 0.2 nm<t2, the thicknesses of the first and second nonmagnetic insertion layers 36 and 37 are made sufficiently large, and thus the lattice mismatch between the nonmagnetic spacer layer and the first ferromagnetic layer and/or the second ferromagnetic layer can be sufficiently reduced. As a result, the nonmagnetic spacer layer 33, and the first ferromagnetic layer 31 and/or second ferromagnetic layer 32 are stacked with a highly crystalline quality, and thus a magnetoresistive effect is particularly increased.

Tables 2 to 4 are tables showing examples of the lattice mismatch of the magnetoresistive effect elements. To be specific, Table 2 is a table that shows examples (first to twenty-eighth examples) of the materials of which the first nonmagnetic insertion layer 36 and/or the second nonmagnetic insertion layer 37 of the present embodiment can be formed and Ag (a twenty-ninth example), and literature data of the lattice constants when these materials have an fcc structure. Table 3 is a table that shows examples (alloys A to G) of the materials of which the first and second ferromagnetic layers 31 and 32 of the present embodiment can be formed, and literature data of the lattice constants of these materials.

Table 4 is a table that shows lattice mismatch rates of the alloys A to G shown in Table 3 with respect to the first to twenty-ninth examples shown in Table 2. The lattice mismatch rates in Table 4 are represented by a percentage, and are obtained by Formula (3) below.

$$\text{Lattice mismatch rate (\%)} = ((a\times\sqrt{2}-b)/b)\times100(\%) \quad (3)$$

In Formula (3), a indicates the lattice constants of the first to twenty-ninth examples shown in Table 2, and b indicates the lattice constants of the alloys A to G shown in Table 3. Further, √2 refers to the square root of two. A lattice mismatch rates between a [110] direction of a (001) plane of each of the first to twenty-ninth examples and a [100] direction of a (001) plane of each of the alloys A to G are calculated by Formula (3).

TABLE 2

|  | FNIL[1] SNIL[2] | Lattice constant (nm) |
|---|---|---|
| First example | $Ag_{0.65}Li_{0.35}$ | 0.4042 |
| Second example | $Ag_{0.79}Al_{0.21}$ | 0.4065 |
| Third example | $Ag_{0.84}Mn_{0.16}$ | 0.4085 |
| Fourth example | $Ag_{0.5}Fe_{0.5}$ | 0.4030 |
| Fifth example | $Ag_{0.5}Ni_{0.5}$ | 0.3830 |
| Sixth example | $Ag_{0.5}Cu_{0.5}$ | 0.3877 |
| Seventh example | $Ag_{0.97}Cu_{0.03}$ | 0.4088 |
| Eighth example | $Ag_{0.84}Ga_{0.16}$ | 0.4072 |
| Ninth example | $Ag_{0.84}Ge_{0.16}$ | 0.4090 |
| Tenth example | $Ag_{0.93}As_{0.07}$ | 0.4097 |
| Eleventh example | $Ag_{0.98}Y_{0.02}$ | 0.4092 |
| Twelfth example | $Ag_{0.5}Pd_{0.5}$ | 0.3911 |
| Thirteenth example | $Ag_{0.99}La_{0.01}$ | 0.4086 |
| Fourteenth example | $Ag_{0.98}Ce_{0.02}$ | 0.4087 |
| Fifteenth example | $Ag_{0.975}Pr_{0.025}$ | 0.4087 |
| Sixteenth example | $Ag_{0.97}Nd_{0.03}$ | 0.4087 |
| Seventeenth example | $Ag_{0.9975}Sm_{0.0025}$ | 0.4087 |
| Eighteenth example | $Ag_{0.9975}Eu_{0.0025}$ | 0.4089 |
| Nineteenth example | $Ag_{0.95}Gd_{0.05}$ | 0.4096 |
| Twentieth example | $Ag_{0.95}Tb_{0.05}$ | 0.4097 |
| Twenty-first example | $Ag_{0.95}Dy_{0.05}$ | 0.4091 |
| Twenty-second example | $Ag_{0.935}Er_{0.065}$ | 0.4099 |
| Twenty-third example | $Ag_{0.99}Yb_{0.01}$ | 0.4088 |
| Twenty-fourth example | $Ag_{0.06}Pt_{0.94}$ | 0.3929 |
| Twenty-fifth example | $Ag_{0.5}Pt_{0.5}$ | 0.3980 |
| Twenty-sixth example | $Ag_{0.67}Pt_{0.33}$ | 0.4004 |
| Twenty-seventh example | $Ag_{0.91}Pt_{0.09}$ | 0.4058 |
| Twenty-eighth example | $Ag_{0.5}Au_{0.5}$ | 0.4077 |
| Twenty-ninth example | Ag | 0.41 |

[1]First nonmagnetic insertion layer
[2]Second nonmagnetic insertion layer

TABLE 3

| | Type of Heusler alloy | Lattice constant (nm) |
|---|---|---|
| Alloy A | $Co_2MnSi$ | 0.5606 |
| Alloy B | $Co_2MnGe$ | 0.5711 |
| Alloy C | $Co_2MnGa$ | 0.577 |
| Alloy D | $Co_2FeGa$ | 0.5677 |
| Alloy E | $Co_2MnAl$ | 0.5664 |
| Alloy F | $Co_2FeAl$ | 0.573 |
| Alloy G | $Co_2FeGeGa$ | 0.574 |

TABLE 4

| | LMR[*] of alloy A (%) | LMR of alloy B (%) | LMR of alloy C (%) | LMR of alloy D (%) | LMR of alloy E (%) | LMR of alloy F (%) | LMR of alloy G (%) | Evaluation |
|---|---|---|---|---|---|---|---|---|
| First example | 1.97 | 0.09 | −0.93 | 0.69 | 0.92 | −0.24 | −0.41 | A |
| Second example | 2.55 | 0.66 | −0.37 | 1.26 | 1.50 | 0.33 | 0.15 | A |
| Third example | 3.06 | 1.17 | 0.13 | 1.77 | 2.01 | 0.83 | 0.66 | A |
| Fourth example | 1.66 | −0.21 | −1.23 | 0.39 | 0.62 | −0.54 | −0.71 | A |
| Fifth example | −3.38 | −5.16 | −6.13 | −4.59 | −4.37 | −5.47 | −5.64 | B |
| Sixth example | −2.21 | −4.01 | −4.99 | −3.43 | −3.21 | −4.32 | −4.49 | B |
| Seventh example | 3.12 | 1.22 | 0.19 | 1.83 | 2.06 | 0.89 | 0.71 | A |
| Eighth example | 2.72 | 0.83 | −0.20 | 1.44 | 1.67 | 0.50 | 0.33 | A |

TABLE 4-continued

| | LMR* of alloy A (%) | LMR of alloy B (%) | LMR of alloy C (%) | LMR of alloy D (%) | LMR of alloy E (%) | LMR of alloy F (%) | LMR of alloy G (%) | Evaluation |
|---|---|---|---|---|---|---|---|---|
| Ninth example | 3.18 | 1.28 | 0.24 | 1.89 | 2.12 | 0.94 | 0.77 | A |
| Tenth example | 3.35 | 1.45 | 0.41 | 2.06 | 2.29 | 1.11 | 0.94 | A |
| Eleventh example | 3.22 | 1.32 | 0.28 | 1.92 | 2.16 | 0.98 | 0.81 | A |
| Twelfth example | −1.34 | −3.15 | −4.14 | −2.57 | −2.35 | −3.47 | −3.64 | B |
| Thirteenth example | 3.09 | 1.19 | 0.16 | 1.80 | 2.03 | 0.86 | 0.68 | B |
| Fourteenth example | 3.10 | 1.20 | 0.17 | 1.81 | 2.04 | 0.87 | 0.69 | A |
| Fifteenth example | 3.10 | 1.21 | 0.17 | 1.81 | 2.05 | 0.87 | 0.69 | A |
| Sixteenth example | 3.11 | 1.21 | 0.18 | 1.82 | 2.05 | 0.88 | 0.70 | A |
| Seventeenth example | 3.11 | 1.21 | 0.18 | 1.82 | 2.05 | 0.88 | 0.70 | A |
| Eighteenth example | 3.15 | 1.26 | 0.22 | 1.86 | 2.10 | 0.92 | 0.74 | A |
| Nineteenth example | 3.33 | 1.43 | 0.39 | 2.04 | 2.27 | 1.09 | 0.92 | A |
| Twentieth example | 3.36 | 1.46 | 0.42 | 2.06 | 2.30 | 1.12 | 0.94 | A |
| Twenty-first example | 3.20 | 1.31 | 0.27 | 1.91 | 2.15 | 0.97 | 0.79 | A |
| Twenty-second example | 3.41 | 1.51 | 0.48 | 2.12 | 2.36 | 1.18 | 1.00 | A |
| Twenty-third example | 3.13 | 1.23 | 0.20 | 1.84 | 2.07 | 0.90 | 0.72 | A |
| Twenty-fourth example | −0.88 | −2.71 | −3.70 | −2.12 | −1.90 | −3.03 | −3.20 | A |
| Twenty-fifth example | 0.40 | −1.44 | −2.45 | −0.85 | −0.63 | −1.77 | −1.94 | B |
| Twenty-sixth example | 1.01 | −0.85 | −1.86 | −0.26 | −0.03 | −1.18 | −1.35 | B |
| Twenty-seventh example | 2.37 | 0.49 | −0.54 | 1.09 | 1.32 | 0.15 | −0.02 | A |
| Twenty-eighth example | 2.85 | 0.96 | −0.07 | 1.57 | 1.80 | 0.63 | 0.45 | A |
| Twenty-ninth example | 3.43 | 1.53 | 0.49 | 2.14 | 2.37 | 1.19 | 1.02 | — |

*LMR is a lattice mismatch rate.

Results of evaluating the first to twenty-eighth examples are also shown in Table 4. Among the first to twenty-eighth examples, those having smaller lattice mismatch rates than the twenty-ninth example with respect to six or more of the alloys A to G were evaluated as "A" that represents "particularly good" in Table 4. Among the first to twenty-eighth examples, those having smaller lattice mismatch rates than the twenty-ninth example with respect to one to five of the alloys A to G were evaluated as "B" that represents "goodness" in Table 4.

As shown in Table 4, the examples (first to twenty-eighth examples) in which γ of the Ag alloy ($Ag_\gamma X_{1-\gamma}$) satisfies 0<γ<1 were evaluated as "A" or "B," and the examples (the first to fourth examples, the seventh to eleventh examples, the fourteenth to twenty-fourth examples, the twenty-seventh example, and the twenty-eighth example) in which γ satisfies 0.75≤γ<1 were evaluated as "A." If the materials of the examples of the evaluation B are used as the first nonmagnetic insertion layer 36 and/or the second nonmagnetic insertion layer 37 of the present embodiment, it is thought that crystallinities of the first ferromagnetic layer 31 and/or second ferromagnetic layer 32 and the nonmagnetic spacer layer 33 are improved, and that a large magnetoresistive effect is exhibited. If the materials of the examples of the evaluation A are used as the first nonmagnetic insertion layer 36 and/or the second nonmagnetic insertion layer 37 of the present embodiment, it is thought that the crystallinities are further improved, and that a larger magnetoresistive effect is exhibited.

EXAMPLES

Hereinafter, the magnetoresistive effect element will be further described using examples and comparative examples of the present disclosure, but the present disclosure is not limited to the following examples.

Table 5 is a table that collectively shows an Ag alloy for the first nonmagnetic insertion layer and the second nonmagnetic insertion layer, thicknesses of the first nonmagnetic insertion layer and the second nonmagnetic insertion layer (thicknesses of the insertion layers), a Heusler alloy ($Co_2L_\alpha M_\beta$) for the first ferromagnetic layer and the second ferromagnetic layer, values of α, β, and α+β, and a normalized MR ratio in the magnetoresistive effect element according to Examples 1 to 25 and Comparative Example 1 prepared as described below.

A magnetoresistive ratio (an MR ratio) in the magnetoresistive effect element is estimated from a magnitude of measured magnetoresistive. The MR ratio is represented by a percentage, and is obtained by Formula (4) below.

$$\text{MR ratio (\%)} = ((R_{AP} - R_P)/R_P) \times 100(\%) \quad (4)$$

In Formula (4), $R_{AP}$ is a magnitude of resistance of the magnetoresistive effect element when a magnetization direction of the first ferromagnetic layer and a magnetization direction of the second ferromagnetic layer are antiparallel, and $R_P$ is a magnitude of resistance of the magnetoresistive effect element when the magnetization direction of the first ferromagnetic layer and the magnetization direction of the second ferromagnetic layer are parallel.

In Table 5, normalized MR ratios of Examples and Comparative Example 1, which are obtained from MR ratios of Examples and Comparative Example 1 measured according to the aforementioned definition, are shown. The normalized MR ratio refers to a value calculated by dividing the MR ratio in Examples and Comparative Example 1 by the MR ratio in Comparative Example 1.

Figure 2:
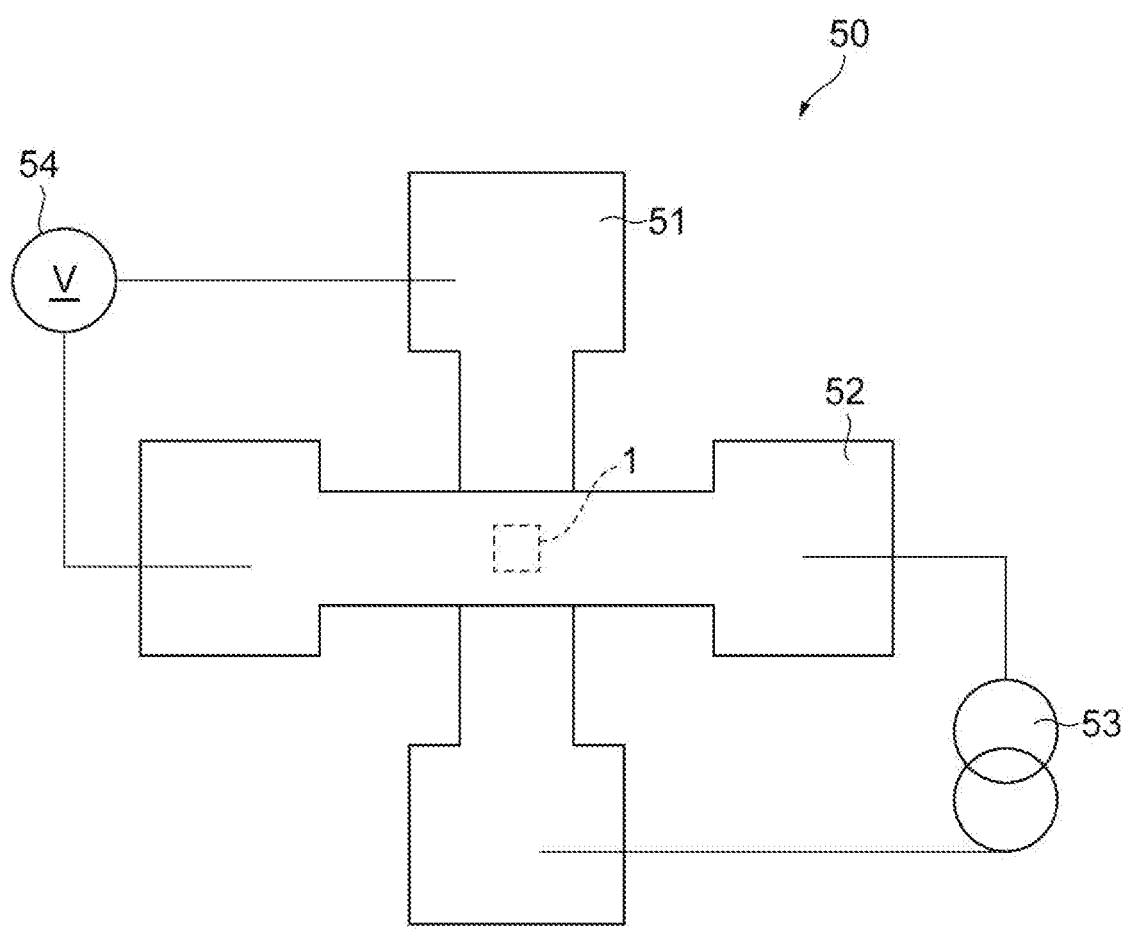
FIG. 2 is a diagram illustrating a magnetoresistive device according to an example.

FIG. 2 is a view illustrating a magnetoresistive device that can evaluate a MR ratio of a magnetoresistive effect element. A magnetoresistive device 50 includes a first electrode layer 51 and a second electrode layer 52 between which the magnetoresistive effect element 1 is interposed. The magnetoresistive effect element 1 is finely processed in a shape suitable for measurement of a magnetoresistive property. The first electrode layer 51 is connected to the substrate 10 of the magnetoresistive effect element 1, and the second electrode layer 52 is connected to the cap layer 40 of the magnetoresistive effect element 1. The magnetoresistive device further includes a power supply 53 and a voltmeter 54. The power supply 53 and the voltmeter 54 are both connected to the first electrode layer 51 and the second electrode layer 52. A current is applied to the magnetoresistive effect element 1 in a stacking direction by the power supply 53, and an applied voltage applied to the magnetoresistive effect element 1 at this time can be monitored by the voltmeter 54. In a state in which a constant current is applied to the magnetoresistive effect element 1 in the stacking direction, the applied voltage applied to the magnetoresistive effect element 1 is monitored by the voltmeter 54 while sweeping a magnetic field to the magnetoresistive effect element from the outside, so that change in the resistance of the magnetoresistive effect element 1 can be measured. The MR ratio of the magnetoresistive effect element 1 can be calculated from a result of measuring the change in resistance. The MR ratios of Examples 1 to 25 and Comparative Example 1 prepared as described below were measured by this magnetoresistive device 50.

Example 1

A magnetoresistive effect element of Example 1 was prepared as follows. A magnetoresistive effect element corresponding to the magnetoresistive effect element 1 of the above embodiment was prepared using $Ag_{0.7}Al_{0.3}$ as a material for the first nonmagnetic insertion layer and the second nonmagnetic insertion layer and using $Co_{0.5}Fe_{0.5}$ as a material for the first ferromagnetic layer and the second ferromagnetic layer. Thicknesses of the first nonmagnetic insertion layer and the second nonmagnetic insertion layer were both set to 0.5 nm. A thickness of the nonmagnetic metal layer using Ag as a material for the nonmagnetic metal layer was set to 5 nm. A thickness of the first ferromagnetic layer was set to 3 nm, and a thickness of the second ferromagnetic layer was set to 3 nm. An MgO single crystal was used for the substrate, and Ag was used for the underlayer. Ru was used for the cap layer. The layers on the substrate were formed by a sputtering method. After the formation of the magnetoresistive effect element, an annealing process in a magnetic field was performed, and uniaxial magnetic anisotropy was imparted to the first ferromagnetic layer and the second ferromagnetic layer. An annealing process temperature during the annealing process in the magnetic field was set to 300° C., and an intensity of the applied magnetic field was set to 5 kOe (399 kA/m).

Examples 2 to 25

Preparation of magnetoresistive effect elements and estimation of MR ratios were performed according to the same preparation and estimation procedures as in Example 1 after a material for the first nonmagnetic insertion layer and the second nonmagnetic insertion layer and a material for the first ferromagnetic layer and the second ferromagnetic layer were changed with respect to Example 1 as shown in Table 5. The materials of the first nonmagnetic insertion layer and the second nonmagnetic insertion layer were identical to each other, and a material for the nonmagnetic metal layer was Ag. The materials of the first ferromagnetic layer and the second ferromagnetic layer were identical to each other. Thicknesses of the nonmagnetic metal layer, the first ferromagnetic layer, and the second ferromagnetic layer were made identical to those of the respective layers of Example 1.

Comparative Example 1

Ag was used as a material for the nonmagnetic metal layer and $Co_{0.5}Fe_{0.5}$ was used as a material for the first ferromagnetic layer and the second ferromagnetic layer. Further, preparation of a magnetoresistive effect element and estimation of an MR ratio were performed according to the same preparation and estimation procedures as in Example 1 without providing the first nonmagnetic insertion layer and the second nonmagnetic insertion layer together. Thicknesses of the nonmagnetic metal layer, the first ferromagnetic layer, and the second ferromagnetic layer were made identical to those of the respective layers of Example 1.

TABLE 5

| | FNIL[1] SNIL[2] | Thickness of Insertion layer (nm) | FFL[3] SFL[4] ($Co_2L_\alpha M_\beta$) | α | β | α + β | Normalized MR value |
|---|---|---|---|---|---|---|---|
| Ex.[5] 1 | $Ag_{0.7}Al_{0.3}$ | 0.5 | $Co_{0.5}Fe_{0.5}$ | — | — | — | 2.7 |
| Ex. 2 | $Ag_{0.8}Al_{0.2}$ | 0.5 | $Co_{0.5}Fe_{0.5}$ | — | — | — | 3.7 |
| Ex. 3 | $Ag_{0.8}Al_{0.2}$ | 0.5 | $Co_2Mn_{1.0}Si_{0.95}$ | 1.0 | 0.95 | 1.95 | 7.9 |
| Ex. 4 | $Ag_{0.98}Y_{0.02}$ | 0.5 | $Co_2Mn_{1.0}Si_{0.95}$ | 1.0 | 0.95 | 1.95 | 10.1 |
| Ex. 5 | $Ag_{0.91}Pt_{0.09}$ | 0.1 | $Co_2Mn_{1.0}Si_{0.95}$ | 1.0 | 0.95 | 1.95 | 7.6 |
| Ex. 6 | $Ag_{0.91}Pt_{0.09}$ | 0.2 | $Co_2Mn_{1.0}Si_{0.95}$ | 1.0 | 0.95 | 1.95 | 6.5 |
| Ex. 7 | $Ag_{0.91}Pt_{0.09}$ | 0.5 | $Co_2Mn_{1.0}Si_{0.95}$ | 1.0 | 0.95 | 1.95 | 11.9 |

TABLE 5-continued

| | FNIL[1] SNIL[2] | Thickness of Insertion layer (nm) | FFL[3] SFL[4] ($Co_2L_\alpha M_\beta$) | α | β | α + β | Normalized MR value |
|---|---|---|---|---|---|---|---|
| Ex. 8 | $Ag_{0.91}Pt_{0.09}$ | 1 | $Co_2Mn_{1.0}Si_{0.95}$ | 1.0 | 0.95 | 1.95 | 12.4 |
| Ex. 9 | $Ag_{0.91}Pt_{0.09}$ | 2 | $Co_2Mn_{1.0}Si_{0.95}$ | 1.0 | 0.95 | 1.95 | 12.5 |
| Ex. 10 | $Ag_{0.91}Pt_{0.09}$ | 5 | $Co_2Mn_{1.0}Si_{0.95}$ | 1.0 | 0.95 | 1.95 | 11.8 |
| Ex. 11 | $Ag_{0.91}Pt_{0.09}$ | 8 | $Co_2Mn_{1.0}Si_{0.95}$ | 1.0 | 0.95 | 1.95 | 10.9 |
| Ex. 12 | $Ag_{0.91}Pt_{0.09}$ | 10 | $Co_2Mn_{1.0}Si_{0.95}$ | 1.0 | 0.95 | 1.95 | 7.2 |
| Ex. 13 | $Ag_{0.91}Pt_{0.09}$ | 12 | $Co_2Mn_{1.0}Si_{0.95}$ | 1.0 | 0.95 | 1.95 | 5.9 |
| Ex. 14 | $Ag_{0.91}Pt_{0.09}$ | 15 | $Co_2Mn_{1.0}Si_{0.95}$ | 1.0 | 0.95 | 1.95 | 5.2 |
| Ex. 15 | $Ag_{0.91}Pt_{0.09}$ | 0.5 | $Co_2Mn_{0.4}Si_{0.95}$ | 0.4 | 0.95 | 1.35 | 3.8 |
| Ex. 16 | $Ag_{0.91}Pt_{0.09}$ | 0.5 | $Co_2Mn_{0.6}Si_{0.95}$ | 0.6 | 0.95 | 1.55 | 4.2 |
| Ex. 17 | $Ag_{0.91}Pt_{0.09}$ | 0.5 | $Co_2Mn_{0.8}Si_{0.95}$ | 0.8 | 0.95 | 1.75 | 10.9 |
| Ex. 18 | $Ag_{0.91}Pt_{0.09}$ | 0.5 | $Co_2Mn_{1.0}Si_{0.95}$ | 1.0 | 0.95 | 1.95 | 11.5 |
| Ex. 19 | $Ag_{0.91}Pt_{0.09}$ | 0.5 | $Co_2Mn_{1.1}Si_{0.95}$ | 1.1 | 0.95 | 2.05 | 16.5 |
| Ex. 20 | $Ag_{0.91}Pt_{0.09}$ | 0.5 | $Co_2Mn_{1.2}Si_{0.95}$ | 1.2 | 0.95 | 2.15 | 19.6 |
| Ex. 21 | $Ag_{0.91}Pt_{0.09}$ | 0.5 | $Co_2Mn_{1.3}Si_{0.95}$ | 1.3 | 0.95 | 2.25 | 23.1 |
| Ex. 22 | $Ag_{0.91}Pt_{0.09}$ | 0.5 | $Co_2Mn_{1.4}Si_{0.95}$ | 1.4 | 0.95 | 2.35 | 22.5 |
| Ex. 23 | $Ag_{0.91}Pt_{0.09}$ | 0.5 | $Co_2Mn_{1.5}Si_{0.95}$ | 1.5 | 0.95 | 2.45 | 20.5 |
| Ex. 24 | $Ag_{0.91}Pt_{0.09}$ | 0.5 | $Co_2Mn_{1.6}Si_{0.95}$ | 1.6 | 0.95 | 2.55 | 8.5 |
| Ex. 25 | $Ag_{0.91}Pt_{0.09}$ | 0.5 | $Co_2Mn_{1.7}Si_{0.95}$ | 1.7 | 0.95 | 2.65 | 3.8 |
| Ex. 26 | $Ag_{0.91}Pt_{0.09}$ | 0.5 | $Co_2Mn_{1.3}Si_{0.55}$ | 1.3 | 0.55 | 1.85 | 5.1 |
| Ex. 27 | $Ag_{0.91}Pt_{0.09}$ | 0.5 | $Co_2Mn_{1.3}Si_{0.65}$ | 1.3 | 0.65 | 1.95 | 6.6 |
| Ex. 28 | $Ag_{0.91}Pt_{0.09}$ | 0.5 | $Co_2Mn_{1.3}Si_{0.75}$ | 1.3 | 0.75 | 2.05 | 19.5 |
| Ex. 29 | $Ag_{0.91}Pt_{0.09}$ | 0.5 | $Co_2Mn_{1.3}Si_{0.85}$ | 1.3 | 0.85 | 2.15 | 20.0 |
| Ex. 30 | $Ag_{0.91}Pt_{0.09}$ | 0.5 | $Co_2Mn_{1.3}Si_{0.95}$ | 1.3 | 0.95 | 2.25 | 23.8 |
| Ex. 31 | $Ag_{0.91}Pt_{0.09}$ | 0.5 | $Co_2Mn_{1.3}Si_{1.05}$ | 1.3 | 1.05 | 2.35 | 24.9 |
| Ex. 32 | $Ag_{0.91}Pt_{0.09}$ | 0.5 | $Co_2Mn_{1.3}Si_{1.15}$ | 1.3 | 1.15 | 2.45 | 23.4 |
| Ex. 33 | $Ag_{0.91}Pt_{0.09}$ | 0.5 | $Co_2Mn_{1.3}Si_{1.25}$ | 1.3 | 1.25 | 2.55 | 23.8 |
| Ex. 34 | $Ag_{0.91}Pt_{0.09}$ | 0.5 | $Co_2Mn_{1.3}Si_{1.35}$ | 1.3 | 1.35 | 2.65 | 15.2 |
| Ex. 35 | $Ag_{0.91}Pt_{0.09}$ | 0.5 | $Co_2Mn_{1.3}Si_{1.45}$ | 1.3 | 1.45 | 2.75 | 4.6 |
| CE[6]1 | — | — | $Co_{0.5}Fe_{0.5}$ | — | — | — | 1.0 |

[1] First nonmagnetic insertion layer
[2] Second nonmagnetic insertion layer
[3] First ferromagnetic layer
[4] Second ferromagnetic layer
[5] Example
[6] Comparative Example Part (a) of FIG. 3 is a diagram illustrating a relationship between α and a normalized MR ratio in Examples 15 to 25. In Examples 15 to 25, β was fixed to 0.95, and α was changed between 0.4 and 1.7. In part (a) of FIG. 3, the normalized MR ratios when 0.7<α<1.6 are surrounded by a broken line.

Part (b) of FIG. 3 is a diagram illustrating a relationship between β and a normalized MR ratio in Examples 26 to 35. In Examples 26 to 35, α was fixed to 1.3, and β was changed between 0.55 and 1.45. In part (b) of FIG. 3, the normalized MR ratios when 0.65<β<1.35 are surrounded by a broken line.

Part (a) of FIG. 4 is a diagram illustrating a relationship between α+β and a normalized MR ratio in Examples 15 to 25 and Examples 26 to 35. In Examples 15 to 25, α+β was changed between 1.35 and 2.65. In Examples 26 to 35, α+β was changed between 1.85 and 2.75. In part (a) of FIG. 4, the normalized MR ratios when 2<α+β<2.6 are surrounded by a broken line.

Part (b) of FIG. 4 is a diagram illustrating a relationship between a thickness t1 of a first nonmagnetic insertion layer or a thickness t2 of a second nonmagnetic insertion layer and the normalized MR ratio in Examples 5 to 14. In Examples 5 to 14, t1 and t2 were equal to each other, and t1 (t2) was changed between 0.1 nm to 15 nm. In part (b) of FIG. 4, the normalized MR ratios when 0.2 nm<t1 (t2)<10 nm are surrounded by a broken line.

As illustrated in part (a) and part (b) of FIG. 3 and part (a) and part (b) of FIG. 4, the magnetoresistive effect element according to all the examples has a larger normalized MR ratio than those according to the comparative examples.

As illustrated in part (a) and part (b) of FIG. 3, when 0.7<α<1.6 and 0.65<β<1.35, the magnetoresistive effect elements according to the examples had larger normalized MR ratios. To be specific, the normalized MR ratios of the magnetoresistive effect element according to the examples exceeded ten. This indicates that the Heusler alloy for the first ferromagnetic layer and the second ferromagnetic layer has lattice constants close to that in a stoichiometric composition when 0.7<α<1.6 and 0.65<β<1.35, and that the lattice mismatch between the Heusler alloy and the Ag alloy ($Ag_\gamma X_{1-\gamma}$ where 0.75<γ<1) comprised by the first nonmagnetic insertion layer and the second nonmagnetic insertion layer is especially reduced. The magnetoresistive effect element of this case includes a first ferromagnetic layer, a nonmagnetic spacer layer, and a second ferromagnetic layer that has good qualities, and exhibits a large magnetoresistive effect.

As illustrated in part (a) of FIG. 4, when 2<α+β<2.6, the magnetoresistive effect elements according to the examples can have a normalized MR ratios exceeding ten. This large normalized MR ratio is based on the result that a Heusler alloy is likely to have half-metal characteristics when 2<α+β<2.6, and a Heusler alloy having half-metal characteristics shows a large magnetoresistive effect.

As illustrated in FIG. 4(b), when 0.2 nm<t1 (t2)<10 nm, the magnetoresistive effect element according to the examples can have a large normalized MR ratio. This large normalized MR ratio is based on the result that the lattice mismatch between the nonmagnetic spacer layer and the first ferromagnetic layer and/or the second ferromagnetic layer is reduced, and the spin scattering is reduced in the electrons moving from the first ferromagnetic layer to the second ferromagnetic layer.

While the present disclosure has been described with reference to the embodiment and the examples, the present disclosure is not limited to the embodiment and the examples, and can be variously modified. For example, the magnetoresistive effect element 1 of the above embodiment can have a current in plane (CIP) structure in which a detecting current flows in a stacking direction instead of a CPP structure.

INDUSTRIAL APPLICABILITY

According to the present embodiment, a magnetoresistive effect element having a large magnetoresistive effect is provided.

REFERENCE SIGNS LIST

1 Magnetoresistive effect element
10 Substrate
15 Crystal orientation layer
20 Underlayer
30 Magnetoresistive layer
31 First ferromagnetic layer
32 Second ferromagnetic layer
33 Nonmagnetic spacer layer
34 Antiferromagnetic layer
35 Nonmagnetic metal layer
36 First nonmagnetic insertion layer
37 Second nonmagnetic insertion layer
40 Cap layer

The invention claimed is:

1. A magnetoresistive effect element comprising:
a first ferromagnetic layer;
a second ferromagnetic layer;
a nonmagnetic layer; and
at least one of a first nonmagnetic insertion layer provided directly on a lower surface of the nonmagnetic layer and a second nonmagnetic insertion layer provided directly on an upper surface of the nonmagnetic layer, the first nonmagnetic insertion layer and the second nonmagnetic insertion layer comprising an Ag alloy represented by General Formula (1), $$Ag_{\gamma}X_{1-\gamma} \qquad (1)$$

where X indicates one element selected from the group consisting of Al, Cu, Ga, Ge, As, Y, La, Sm, Yb, and Pt, and $0 < \gamma < 1$.

2. The magnetoresistive effect element according to claim 1, wherein a crystalline structure of the Ag alloy represented by General Formula (1) has a face-centered cubic lattice structure.

3. The magnetoresistive effect element according to claim 1, wherein, in General Formula (1), $0.75 < \gamma < 1$.

4. The magnetoresistive effect element according to claim 1, wherein at least one of the first ferromagnetic layer and the second ferromagnetic layer comprises a Heusler alloy represented by General Formula (2), $$Co_2L_{\alpha}M_{\beta} \qquad (2)$$

where L is at least one or more elements of Mn and Fe, M indicates one or more elements selected from the group consisting of Si, Al, Ga, and Ge, $0.7 < \alpha < 1.6$, and $0.65 < \beta < 1.35$.

5. The magnetoresistive effect element according to claim 4, wherein, in General Formula (1), X is one element selected from the group consisting of Y, La, Sm, Yb, and Pt.

6. The magnetoresistive effect element according to claim 4, wherein, in General Formula (2), $2 < \alpha + \beta < 2.6$.

7. The magnetoresistive effect element according to claim 1, wherein:
when a thickness of the first nonmagnetic insertion layer is defined as t1, t1 satisfies 0.2 nm<t1<10 nm; and
when a thickness of the second nonmagnetic insertion layer is defined as t2, t2 satisfies 0.2 nm<t2<10 nm.

8. The magnetoresistive effect element according to claim 2, wherein, in General Formula (1), $0.75 < \gamma < 1$.

9. The magnetoresistive effect element according to claim 2, wherein at least one of the first ferromagnetic layer and the second ferromagnetic layer comprises a Heusler alloy represented by General Formula (2), $$Co_2L_{\alpha}M_{\beta} \qquad (2)$$

where L is at least one or more elements of Mn and Fe, M indicates one or more elements selected from the group consisting of Si, Al, Ga, and Ge, $0.7 < \alpha < 1.6$, and $0.65 < \beta < 1.35$.

10. The magnetoresistive effect element according to claim 2, wherein:
when a thickness of the first nonmagnetic insertion layer is defined as t1, t1 satisfies 0.2 nm<t1<10 nm; and
when a thickness of the second nonmagnetic insertion layer is defined as t2, t2 satisfies 0.2 nm<t2<10 nm.

11. The magnetoresistive effect element according to claim 3, wherein at least one of the first ferromagnetic layer and the second ferromagnetic layer comprises a Heusler alloy represented by General Formula (2), $$Co_2L_{\alpha}M_{\beta} \qquad (2)$$

where L is at least one or more elements of Mn and Fe, M indicates one or more elements selected from the group consisting of Si, Al, Ga, and Ge, $0.7 < \alpha < 1.6$, and $0.65 < \beta < 1.35$.

12. The magnetoresistive effect element according to claim 3, wherein:
when a thickness of the first nonmagnetic insertion layer is defined as t1, t1 satisfies 0.2 nm<t1<10 nm; and
when a thickness of the second nonmagnetic insertion layer is defined as t2, t2 satisfies 0.2 nm<t2<10 nm.

13. The magnetoresistive effect element according to claim 4, wherein:
when a thickness of the first nonmagnetic insertion layer is defined as t1, t1 satisfies 0.2 nm<t1<10 nm; and
when a thickness of the second nonmagnetic insertion layer is defined as t2, t2 satisfies 0.2 nm<t2<10 nm.

14. The magnetoresistive effect element according to claim 2, wherein at least one of the first ferromagnetic layer and the second ferromagnetic layer comprises a Heusler alloy represented by General Formula (2), $$Co_2L_{\alpha}M_{\beta} \qquad (2)$$

where L is at least one or more elements of Mn and Fe, M indicates one or more elements selected from the group consisting of Si, Al, Ga, and Ge, $0.7 < \alpha < 1.6$, and $0.65 < \beta < 1.35$,
wherein, in General Formula (1), X is one element selected from the group consisting of Y, La, Sm, Yb, and Pt.

15. The magnetoresistive effect element according to claim 2, wherein at least one of the first ferromagnetic layer and the second ferromagnetic layer comprises a Heusler alloy represented by General Formula (2), $$Co_2L_{\alpha}M_{\beta} \qquad (2)$$

where L is at least one or more elements of Mn and Fe, M indicates one or more elements selected from the group consisting of Si, Al, Ga, and Ge, $0.7<\alpha<1.6$, and $0.65<\beta<1.35$, wherein, in General Formula (2), $2<\alpha+\beta<2.6$.

16. The magnetoresistive effect element according to claim 2, wherein at least one of the first ferromagnetic layer and the second ferromagnetic layer comprises a Heusler alloy represented by General Formula (2), $$Co_2L_\alpha M_\beta \qquad (2)$$

where L is at least one or more elements of Mn and Fe, M indicates one or more elements selected from the group consisting of Si, Al, Ga, and Ge, $0.7<\alpha<1.6$, and $0.65<\beta<1.35$, wherein:

when a thickness of the first nonmagnetic insertion layer is defined as t1, t1 satisfies 0.2 nm<t1<10 nm; and when a thickness of the second nonmagnetic insertion layer is defined as t2, t2 satisfies 0.2 nm<t2<10 nm.

17. The magnetoresistive effect element according to claim 3, wherein at least one of the first ferromagnetic layer and the second ferromagnetic layer comprises a Heusler alloy represented by General Formula (2), $$Co_2L_\alpha M_\beta \qquad (2)$$

where L is at least one or more elements of Mn and Fe, M indicates one or more elements selected from the group consisting of Si, Al, Ga, and Ge, $0.7<\alpha<1.6$, and $0.65<\beta<1.35$, wherein:

when a thickness of the first nonmagnetic insertion layer is defined as t1, t1 satisfies 0.2 nm<t1<10 nm; and when a thickness of the second nonmagnetic insertion layer is defined as t2, t2 satisfies 0.2 nm<t2<10 nm.

18. The magnetoresistive effect element according to claim 4, wherein, in General Formula (1), X is one element selected from the group consisting of Y, La, Sm, Yb, and Pt, wherein, in General Formula (2), $2<\alpha+\beta<2.6$.

19. The magnetoresistive effect element according to claim 4, wherein, in General Formula (1), X is one element selected from the group consisting of Y, La, Sm, Yb, and Pt, wherein:

when a thickness of the first nonmagnetic insertion layer is defined as t1, t1 satisfies 0.2 nm<t1<10 nm; and when a thickness of the second nonmagnetic insertion layer is defined as t2, t2 satisfies 0.2 nm<t2<10 nm.

20. The magnetoresistive effect element according to claim 4, wherein, in General Formula (2), $2<\alpha+\beta<2.6$, wherein:

when a thickness of the first nonmagnetic insertion layer is defined as t1, t1 satisfies 0.2 nm<t1<10 nm; and when a thickness of the second nonmagnetic insertion layer is defined as t2, t2 satisfies 0.2 nm<t2<10 nm.

* * * * *